United States Patent [19]
Frisbie et al.

[11] Patent Number: 6,037,789
[45] Date of Patent: Mar. 14, 2000

[54] WIPING CONTACTS

[75] Inventors: Milo W. Frisbie; Mavin C. Swapp, both of Mesa, Ariz.

[73] Assignee: Motorola, Inc., Schaumburg, Ill.

[21] Appl. No.: 07/969,541

[22] Filed: Oct. 30, 1992

Related U.S. Application Data

[63] Continuation of application No. 07/582,819, Sep. 13, 1990, abandoned, which is a continuation of application No. 07/413,034, Sep. 27, 1989, abandoned.

[51] Int. Cl.[7] .................................................. G01R 1/073
[52] U.S. Cl. .......................................... 324/757; 324/754
[58] Field of Search ........................... 324/158 P, 158 F, 324/72.5, 73.1, 757, 754, 758; 439/70, 86

[56] References Cited

U.S. PATENT DOCUMENTS

| | | | |
|---|---|---|---|
| 3,107,963 | 10/1963 | Hansen | 324/158 F |
| 3,175,153 | 3/1965 | Paessler | 324/158 F |
| 3,286,181 | 11/1966 | Dudash, Jr. et al. | 324/158 F |
| 3,613,001 | 10/1971 | Hostetter | 324/158 P |
| 3,781,681 | 12/1973 | Wagner et al. | 324/158 P |
| 3,989,331 | 11/1976 | Hanlon | 439/70 |
| 3,995,213 | 11/1976 | Robinson et al. | 324/64 |
| 4,045,735 | 8/1977 | Worcester et al. | 439/912 |
| 4,060,296 | 11/1977 | Kunkle et al. | 439/70 |
| 4,068,170 | 1/1978 | Chayka et al. | 324/158 F |
| 4,175,253 | 11/1979 | Pitegoff | 324/64 |
| 4,308,498 | 12/1981 | Madajewski et al. | 324/64 |
| 4,320,339 | 3/1982 | Vancelette | 324/73.1 |
| 4,473,798 | 9/1984 | Cedrone et al. | 324/158 P |
| 4,531,791 | 7/1985 | Bauchet | 439/851 |
| 4,689,556 | 8/1987 | Cedrone | 324/158 F |
| 4,835,464 | 5/1989 | Slye et al. | 324/158 F |
| 4,836,797 | 6/1989 | Riechelmann | 439/912 |
| 4,846,702 | 7/1989 | Ignasiak et al. | 439/912 |
| 4,866,374 | 9/1989 | Cedrone | 439/912 |
| 4,950,980 | 8/1990 | Pfaff | 324/158 R |

*Primary Examiner*—Ernest F. Karlsen
*Attorney, Agent, or Firm*—Joe E. Barbee; Miriam Jackson; Daniel R. Collopy

[57] ABSTRACT

Throughput and accuracy of testing of a semiconductor device is improved by forming the contacts to allow the leads of a packaged semiconductor device to pass through the contacts. Both AC and DC testing may be done because the contact length is substantially shortened.

11 Claims, 1 Drawing Sheet

WIPING CONTACTS

This application is a continuation of prior application Ser. No. 07/582,819, filed Sep. 13, 1990, now abandoned, which is a continuation of prior application Ser. No. 07/413,034, filed Sep. 27, 1989, now abandoned.

BACKGROUND OF THE INVENTION

This invention relates, in general, to the testing of semiconductor devices, and more particularly, to an apparatus for testing of packaged semiconductor devices.

In the past, the testing of semiconductor devices packaged in dual inline (DIL) packages, or semiconductor packages similar thereto, has been accomplished by using activated contacts. Activated contacts make electrical contact to the outside of each lead of a packaged semiconductor device. The productivity or throughput of testing products using activated contacts is slow because time is taken up waiting for the contacts to stop moving and make good electrical contact. In addition, activated contacts have long lead lengths which represent non-transmission lines. Thus, because of the losses which take place, the activated contacts are only good for DC testing, but not AC testing. In order to make an activated contact a transmission line, a ground plane must be added to the activated contacts. This reduces the losses and allows AC testing to take place. It is also very difficult to provide Kelvin contacts to an activated contact apparatus, because the contacts are large compared to the package leads. Kelvin contacts provide for better accuracy in measurement, therefore, inaccuracies in measurement must be tolerated when using activated contacts. Lastly, activated contacts use about 30 grams of pressure when testing each part, thus the contacts, which are typically made of a beryllium/copper alloy, must be replaced frequently due to wear.

Other methods of testing semiconductor devices in SOIC (Small Outline Integrated Circuit) packages are not directly compatible with the testing of dual inline packages. The leads of an SOIC are bent in a "J" configuration, while the leads of a dual inline package are straight. Thus, a method of making contact to the bottom surface of the leads of an SOIC can not be used for dual inline packages or other similar packages.

Accordingly, it is an object of the present invention to provide an apparatus for testing packaged semiconductor devices with an improved productivity.

Another object of the present invention is to provide an apparatus for testing packaged semiconductor devices which has shorter contact lead lengths which allows for AC and DC testing.

An additional object of the present invention is to provide an apparatus for testing packaged semiconductor devices which improves accuracy by providing a Kelvin contact.

A further object of the present invention is to provide an apparatus for testing semiconductor devices which provides for less wear.

SUMMARY OF THE INVENTION

The above and other objects and advantages of the present invention are achieved by providing an apparatus for testing semiconductor devices which utilizes wiping contacts rather than activated contacts. The wiping contact apparatus has at least one contact which makes electrical contact to a side of each lead of a semiconductor device. Two contacts which are bifurcated may be used to improve testing accuracy. In addition, bifurcated Kelvin contacts may be easily added in order to improve the accuracy of measurement. The wiping contacts are preferably made of an alloy comprised of platinum, gold and silver. This provides for contacts which do not oxidize and reduce replacement frequency.

DETAILED DESCRIPTION OF THE INVENTION

Figure 1:
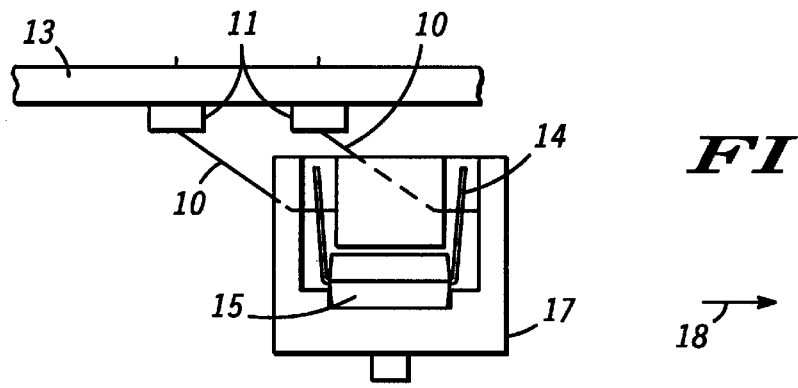
FIG. 1 is a side view of a testing apparatus and a device under test according to one embodiment of the present invention.

FIG. 1 illustrates a side view of the testing of a packaged semiconductor device 15 with wiping contacts 10 according to one embodiment of the present invention. Wiping contacts 10 are formed in a contact molded assembly 11, which connects to a loadboard 13. Loadboard 13 is then connected to a tester (not shown). A first and second plurality of wiping contacts 10 is used in this embodiment because dual inline package 15 has a first and second plurality of leads 14 parallel to each other. A plurality of wiping contacts 10 may also be formed in a single contact molded assembly 11. Package 15 shown is a dual inline package, however, the present invention would also apply to other types of packages. Dual inline package 15 is positioned by transfer pocket 17 such that contacts 10 make electrical contact by wiping the sides of leads 14 as transfer pocket 17 moves horizontally in the direction of arrow 18.

Figure 2:
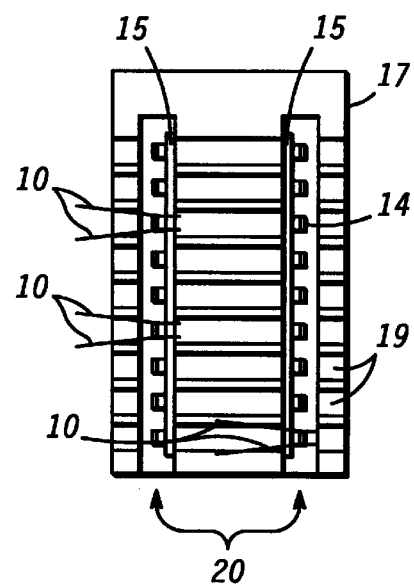
FIG. 2 is a top view of a portion of a testing apparatus according to one embodiment of the present invention.

FIG. 2 better illustrates wiping contacts 10 making electrical contact to leads 14 of dual inline package 15. The top view of transfer pocket 17 illustrates contact slots 19 and lead slots 20. Contact slots 19 are located so as to match the locations of leads 14 of dual inline package 15 and guide wiping contacts 10 across leads 14. As can be seen in FIG. 2, contacts 10 are bifurcated contacts which make electrical contact to each side of lead 14. Although only one contact 10 is necessary to make electrical contact with a lead, providing bifurcated contacts 10 reduces the percentage of not making electrical contact to packaged semiconductor device 15 under test. In addition, bifurcated Kelvin contacts may be added (not shown in FIG. 2) to improve the accuracy of testing. Making electrical contact by wiping the sides of lead 14 instead of making direct contact to the outer edge of lead 14 uses only approximately 2 grams of pressure, therefore contacts 10 do not need to be replaced as frequently as activated contacts. In addition, because wiping contacts 10 are very small and have very short lead lengths, they may be fabricated using an alloy of platinum, gold, and silver. Other suitable alloys may be used. Prior art contacts are typically large and have long lead lengths, thus are made of a less expensive alloy, such as a gold plated beryllium and copper alloy which is not as hard as the platinum, gold, and silver alloy. In addition, because wiping contacts 10 can be fabricated to have short lead lengths, both AC and DC testing can be done.

Figure 3:
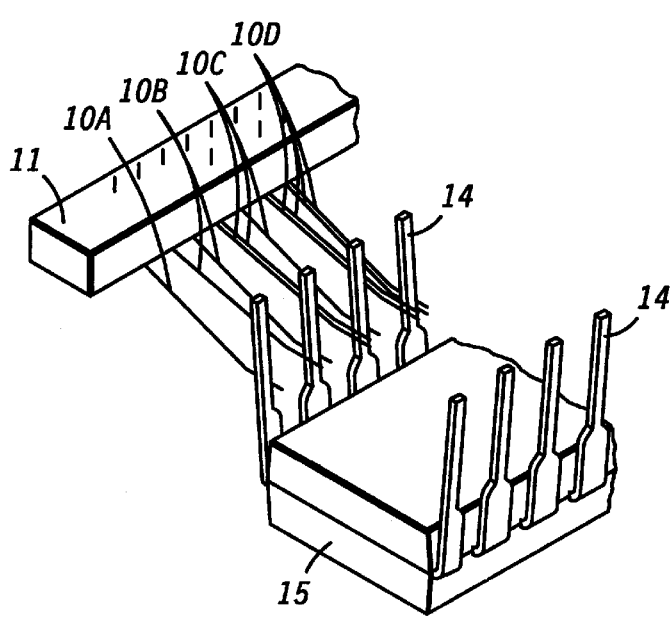
FIG. 3 illustrates a perspective view of a portion of a testing apparatus according to one embodiment of the present invention.

FIG. 3 illustrates a perspective view of wiping contacts 10 making electrical contact to leads 14. Only some of the wiping contacts 10 have been illustrated in both FIGS. 2 and 3 in order to simplify the drawings. FIG. 3 more readily illustrates various embodiments of the present invention. In a first embodiment, a single wiping contact 10A may be used to make electrical contact to the side of each lead 14. In a second embodiment, 10B illustrates two bifurcated wiping contacts may be used, which can be two contacts which provide voltage for testing or one to provide the voltage and a Kelvin contact to provide for accuracy. Contacts 10C illustrate a third embodiment, which is preferably comprised of two bifurcated voltage contacts and one Kelvin contact. Contacts 10D illustrate a fourth embodiment, which is comprised of two bifurcated voltage contacts and two bifurcated Kelvin contacts. FIG. 3 also more readily illustrates how leads 14 pass through wiping contacts 10, which allows for a substantial increase in throughput. Note also that transfer pocket 17 is not shown in FIG. 3 to illustrate that other means may be used to position package 15 such that leads 14 pass through wiping contacts 10.

By now it should be appreciated that there has been provided an improved apparatus for testing of semiconductor devices packaged in dual inline packages, and packages similar thereto.

We claim:

1. A method of testing a semiconductor device, comprising the steps of:

providing a plurality of wiping contacts;

providing a semiconductor device having a plurality of leads;

positioning the semiconductor device wherein the plurality of leads are between, but not making electrical contact to the plurality of the wiping contacts;

moving the semiconductor device in one direction from the point where the plurality of leads are between, but not making electrical contact to the plurality of the wiping contacts past the plurality of the wiping contact wires such that the plurality of the leads of the semiconductor device are no longer between the plurality of wiping contacts, wherein at least one of the plurality of wiping contacts makes electrical contact to a side of one of the plurality of leads of the semiconductor device during the moving of the semiconductor device.

2. The method of claim 1, wherein the step of providing a plurality of wiping contacts also comprises providing a plurality of Kelvin contacts so that at least one of the plurality of Kelvin contacts makes electrical contact to the side of one of the plurality of leads of the semiconductor device when the semiconductor device is moved past the plurality of wiping contacts and the plurality of Kelvin contacts.

3. The method of claim 2, wherein the step of providing the plurality of wiping contacts and the plurality of Kelvin contacts comprises the plurality of wiping contacts and the plurality of Kelvin contacts made of an alloy comprised of platinum, gold, and silver.

4. The method of claim 1 wherein the step of providing the plurality of wiping contacts comprises providing the plurality of wiping contacts configured to allow the plurality of leads of the semiconductor device to pass through the plurality of wiping contacts as the semiconductor device moves past the plurality of wiping contacts to increase throughput of testing.

5. The method of claim 1 wherein the step of providing a plurality of wiping contacts comprises providing the plurality of wiping contacts having a short lead length such that AC and DC testing of the semiconductor device may be done.

6. A method of testing a plurality of semiconductor devices, comprising the steps of:

providing a plurality of wiping contact wires;

providing a semiconductor device having a plurality of leads;

positioning the semiconductor device wherein the plurality of leads are between, but not making electrical contact to the plurality of the wiping contact wires; and moving the semiconductor device in one direction from the point where the plurality of leads are between, but not making electrical contact to the plurality of the wiping contact wires past and through the plurality of the wiping contact wires such that the plurality of the leads of the semiconductor device are no longer between the plurality of wiping contact wires, wherein at the plurality of wiping contact wires makes electrical contact to a side of each of the plurality of leads of the semiconductor device as the semiconductor device moves past and through the plurality of wiping contact wires.

7. The method of claim 6, wherein the step of providing a plurality of wiping contact wires also comprises providing a plurality of Kelvin contact wires so that at least one of the plurality of Kelvin contact wires makes electrical contact to the side of one of the plurality of leads of the semiconductor device when the semiconductor device is moved past the plurality of wiping contact wires and the plurality of Kelvin contact wires.

8. The method of claim 7, wherein the step of providing the plurality of wiping contact wires and the plurality of Kelvin contact wires comprises the plurality of wiping contact wires and the plurality of Kelvin contact wires made of an alloy comprised of platinum, gold, and silver.

9. The method of claim 6 wherein the step of providing the plurality of wiping contact wires comprises providing the plurality of wiping contact wires configured to allow the plurality of leads of the semiconductor device to pass through the plurality of wiping contact wires as the semiconductor device moves past the plurality of wiping contact wires to increase throughput of testing.

10. The method of claim 6 wherein the step of providing a plurality of wiping contact wires comprises providing the plurality of wiping contact wires having a short lead length such that AC and DC testing of the semiconductor device may be done.

11. The method of claim 6 wherein the step of providing the plurality of wiping contact wires comprises providing the plurality of wiping contact wires configured to apply approximately 2 grams of pressure during testing of the semiconductor device.

* * * * *